(12) United States Patent
Mayrhofer

(10) Patent No.: US 10,060,983 B2
(45) Date of Patent: Aug. 28, 2018

(54) METHOD AND APPARATUS FOR DETERMINING A PHYSICAL QUANTITY OF A MULTIPHASE SYNCHRONOUS MACHINE

(71) Applicant: B&R INDUSTRIAL AUTOMATION GMBH, Eggelsberg (AT)

(72) Inventor: Andreas Mayrhofer, Timelkam (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 154 days.

(21) Appl. No.: 15/191,894

(22) Filed: Jun. 24, 2016

(65) Prior Publication Data

US 2016/0377682 A1    Dec. 29, 2016

(30) Foreign Application Priority Data

Jun. 25, 2015   (AT) .............................. A 50553/2015

(51) Int. Cl.
  *G01R 31/34*  (2006.01)
  *H02P 31/00*  (2006.01)
  *H02P 23/14*  (2006.01)

(52) U.S. Cl.
  CPC .............. *G01R 31/34* (2013.01); *H02P 23/14* (2013.01); *H02P 31/00* (2013.01)

(58) Field of Classification Search
  CPC ..... G01R 31/34; G01R 31/343; G01R 31/346
  See application file for complete search history.

(56) References Cited

U.S. PATENT DOCUMENTS

| 7,737,652 B2 | 6/2010 | Schwesig |
| 9,369,079 B2 | 6/2016 | Fu |

(Continued)

FOREIGN PATENT DOCUMENTS

| DE | 10251095 | 5/2004 |
| DE | 102006042038 | 2/2008 |

(Continued)

OTHER PUBLICATIONS

Austria Office Action and Search Report conducted in counterpart Austria Appln. No. A 50553/2015 (dated Jun. 13, 2016) (w/English translation).

*Primary Examiner* — Tung X Nguyen
(74) *Attorney, Agent, or Firm* — Greenblum & Bernstein, P.L.C.

(57) ABSTRACT

To reliably determine a state variable (G) of a polyphase synchronous machine (1) that is supplied with electric current by a polyphase power network (2) with n phases (U, . . . , N), where n≥3, the current values of at least n−1 phase currents ($I_u$, . . . , $I_{n-1}$) from at least n−1 phases (U, . . . , N-1) of the polyphase power network (2) are detected. The state variable (G) is determined by means of the at least n−1 instantaneous current values ($I_u$, . . . , $I_{n-1}$), the current values of all n phase currents ($I_u$, . . . , $I_n$) from the n-phase polyphase power network (2) being detected and the n phase currents ($I_u$, . . . , $I_n$) being correlated with one another. The result of the correlation of all n phase currents ($I_u$, . . . , $I_n$) is used for a plausibility check of the n−1 phase currents ($I_u$, . . . , $I_{n-1}$) used to determine the state variable (G).

13 Claims, 4 Drawing Sheets

(56) References Cited

U.S. PATENT DOCUMENTS

| | | | |
|---|---|---|---|
| 2011/0058300 A1* | 3/2011 | Krauss | H02H 3/083 |
| | | | 361/115 |
| 2014/0368147 A1* | 12/2014 | Barrenscheen | H02H 3/083 |
| | | | 318/490 |
| 2017/0310244 A1* | 10/2017 | Goetting | H02M 7/53871 |

FOREIGN PATENT DOCUMENTS

| | | |
|---|---|---|
| DE | 102010006593 | 8/2011 |
| DE | 102010006594 | 8/2011 |
| DE | 102011075387 | 11/2012 |
| DE | 102011108417 | 1/2013 |

* cited by examiner

METHOD AND APPARATUS FOR DETERMINING A PHYSICAL QUANTITY OF A MULTIPHASE SYNCHRONOUS MACHINE

CROSS-REFERENCE TO RELATED APPLICATIONS

This application claims priority under 35 U.S.C. § 119(a) of Austrian Patent Application No. A 50553/2015 filed Jun. 25, 2015, is expressly incorporated by reference herein in its entirety.

BACKGROUND OF THE INVENTION

1. Field of the Invention

The invention relates to a method and a device for reliably determining a state variable of a polyphase synchronous machine that is supplied with electric current by a polyphase power network with $n \geq 3$ phases, with current values of at least $n-1$ phase currents from at least $n-1$ phases of a polyphase power network being detected and a state variable being calculated by means of the at least $n-1$ first up-to-date current values. Furthermore, the invention relates to the use of the method for the safe operation of a polyphase synchronous machine.

2. Discussion of Background Information

An extremely wide variety of safety functions and safety monitoring aspects are used in connection with electrical drives in the form of components driven by electric motors. Their purpose is to reduce the risks both to people and to the electric drive itself and to systems driven by same.

Safely Limited Torque (SLT) is among the monitoring functions that are most commonly used in connection with electric drives. In general, one speaks in this context of the "safe limited torque function" or "SLT function," for which reason it will be hereinafter referred to only as an SLT function.

The purpose of an SLT function is to prevent an electric drive from exceeding a threshold value or an established torque or, when using a linear motor, an established force. For this purpose, the current torque of the electric motor or a torque elsewhere on the drive—or, in the case of a linear motor, the current force—is monitored by the SLT function. Reference will often be made in the following to a torque of the electric drive, although the explantions also apply analogously to the force of a linear motor.

The fact that a permissible value for the torque of the electric drive is not exceeded results in a certain safety function, for example when foreign bodies are drawn into a system driven by the electric drive. By virtue of the safety function, the drive can be made torque-free, for example, or a warning can simply be outputted. This contributes, for example, to the fact that the operating staff of a system or the system itself can be protected from damage. The overshooting of a permissible torque is first registered by the SLT function. In principle, in order to be able to evaluate an existing hazardous situation, the current torque must be determined. Since the decision to deactivate the drive or to output a warning signal is based on this determination of the torque, this is usually done in multiple channels in order guarantee a certain level of reliability through redundancy. However, the torque (force) is only one state variable of the electric drive on which the SLT function can be based. Instead of the torque, the motor currents could also be monitored. Likewise, the instantaneous power of the electric motor could also be used as a state variable. What is essential here is that the SLT function be based on a detectable or determinable state variable of the electric drive whose correctness can be trusted.

For this purpose, DE 10 2010 006 593 A1 makes a provision of determining the torque of an electric drive by means of a calculated current space vector, for example. To this end, a current sensor is first arranged in at least two phases of the three-phase supply network being used. The detected instantaneous current values are fed to a safety monitor which, in turn, calculates the current space vector and thus determines an instantaneous torque. In order to impart a certain level of reliability to the determination of the current space vector in this form, a current sensor is additionally arranged in the third phase. Three different current pairs are thus available to determine the current space vector. A current space vector or an instantaneously acting torque can be determined from each of these current pairs. The torques calculated from the current pairs or current space vectors are compared to one another. A deviation of the calculated torques is indicative of a possible error in the detection of the current pairs or the calculation thereof. Subsequent to such a deviation, a shutdown of the power electronics of the drive system (Safe Torque Off, STO) is triggered. DE 10 2010 006 593 A1 will be explained in further detail below with reference to FIG. 4.

In DE 10 2010 006 593 A1, two separate circuits are used to calculate the current space vector, each of which has its own microcontroller. Each of the microcontrollers uses a different current pair for the calculation of the current space vector or of the torque. Note, however, that three instantaneous current values are available in a three-phase supply network. Therefore, one of the instantaneous current values must be used twice for the calculation during the dual calculation by two microcontrollers. In the event of a faulty sensor detecting the instantaneous current value that is used twice, a faulty value is fed to both microcontrollers as the basis of calculation. Despite the faulty measurement of the current value, both microcontrollers would therefore calculate the same incorrect torque. A comparison of the calculated torques would therefore not turn up any error, for which reason the drive may not be shut down even though a critical torque has been exceeded.

If the possible other, third current pair is used for further checking in the three-phase supply network, one of the two microcontrollers must carry out the arithmetic operation twice. While this means that a third value is available for checking the calculated torque, a possible error in one of the two microcontrollers must also be considered. In some circumstances, an incorrectly measured instantaneous current value in combination with a faulty microcontroller has the effect of an error not being detected in the comparison of the torques, which are defective, after all.

It is therefore not possible according to the prior art to reliably determine the torque required for the reliable shutdown of the drive, and situations can arise in which an incorrectly determined torque is not identified. Both are problematic for a safety function.

It is the object of the present invention to provide a method and a device for the reliable detection of a state variable of a polyphase synchronous machine located in a polyphase power network with three or more phases.

SUMMARY OF THE EMBODIMENTS

This object is achieved by the present invention in that, in the polyphase network in which $n \geq 3$ phases are present, all n instantaneous current values of the n phase currents are detected and used for a plausibility check of the at least n−1 first instantaneous current values. As a result, it is checked at an early stage whether current values that are to be used for additional calculations are suitable or plausible for further calculation. A check is therefore not performed, like in the case of the three-phase network in the prior art, through a comparison of two physical quantities calculated from different current values. In the present invention, the detected instantaneous current values themselves are subjected to a check. This enables immediate checking, thus minimizing cumulative errors resulting from additional intermediate steps and calculations.

Advantageously, the plausibility check can be done in such a way that Kirchhoff's first law, also known as Kirchhoff's current law or nodal rule, is applied to the instantaneous phase currents. Kirchhoff's first law states that the current sum at a nodal point must be equal to zero or, to put it differently, the sum of the incoming currents must correspond to the sum of the outgoing currents. In the case of the present star connection of the stator winding, direct application of Kirchhoff's first law is possible provided that the star point is not grounded. In the case of an n-gon circuit of the stator windings, direct summation of the phase currents is also possible. The plausibility of the detected currents can easily be checked using the result of the summation.

Advantageously, the result of the plausibility check is outputted in the form of a plausibility signal. Such an output, which can lead to an optical or acoustic indication, for example, makes it possible to report an error in the detection of the current values early on or to process an identified error in a different manner.

One advantageous embodiment makes a provision that a first current component is formed from the at least n−1 first instantaneous current values. This first current component can already itself represent a state variable or another state variable can be calculated therefrom, for example through correlation with an arithmetic constant. To this end, an advantageous embodiment makes a provision that a torque is calculated as a state variable.

Advantageously, a provision is made that the currently acting state variable is compared to a threshold value and a comparative result is outputted. The comparison provides information about possible ranges being reached that may need to be avoided for safety reasons. The outputting of the comparative result enables a great number of possible actions that can be taken based on the comparative result.

A provision can advantageously be made in this regard that the reaching or overshooting of the threshold value triggers a save torque off function. As a result of a save torque off function, the electric drive or the polyphase synchronous machine no longer receives any current that might lead to a rotational movement.

The embodiment according to the invention can also have multiple channels or redundant modules, thus ensuring a certain level of reliability. The results determined in this parallel manner can be compared and, if unequal, a signal can be outputted or the save torque off function can be triggered.

BRIEF DESCRIPTION OF THE DRAWINGS

The present invention is explained in more detail below with reference to FIGS. 1 to 8, which show advantageous embodiments of the invention in exemplary, schematic and non-limiting fashion.

DETAILED DESCRIPTION OF THE EMBODIMENTS

Figure 1:
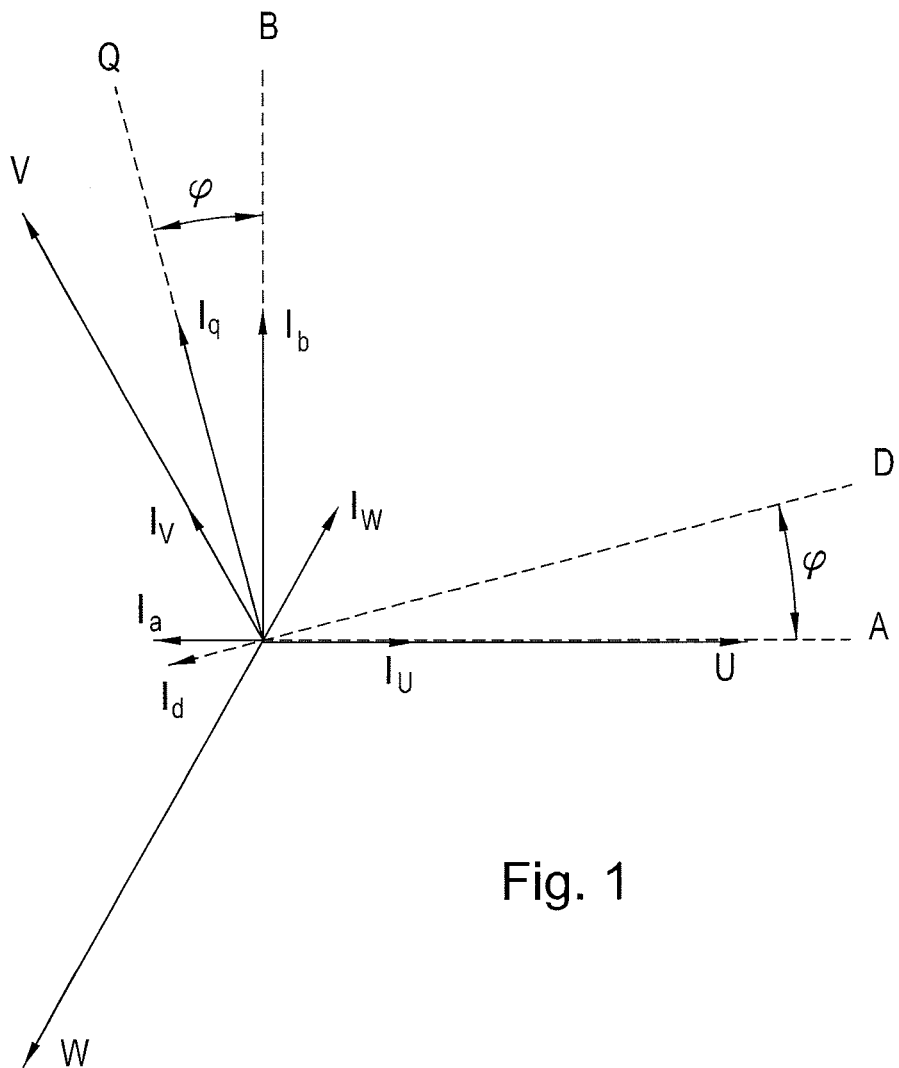
FIG. 1 shows three phases of the three-phase polyphase power network with the stator-fixed and the rotor-fixed coordinate system.

FIG. 1 illustrates the three phases U, V and W of a three-phase polyphase power network in a known star-shaped arrangement. At any point in time, an instantaneous current value of the phase currents $I_u$, $I_v$, and $I_w$ can be associated with each phase U, V, W, these phase currents $I_u$, $I_v$, $I_w$ each being rotated by 360°/3=120° with respect to one another according to the star-shaped illustration. In a known manner, the vector sum of the phase currents $I_u$, $I_v$, and $I_w$ results in a rotating current space vector (not shown). A biaxial, rectangular coordinate system is usually associated with the stator and the rotor of a polyphase synchronous machine 1. In FIG. 1, the axes A and B represent the axes of the biaxial, rectangular coordinate system AB of the stator. The axes Q and D form the biaxial, rectangular coordinate system QD of the rotor, which is "connected" to the rotor and thus rotates with the rotor.

FIG. 1 shows a state in which the rotor, and the rotor-fixed coordinate system QD, is rotated by a rotation angle φ in relation to the stator and hence the stator-fixed coordinate system AB, for which reason the corresponding, associated coordinate systems QD, AB are also shown to be rotated by the rotation angle φ in relation to one another.

With the aid of a linear transformation, namely the known Clarke transformation, it is general possible to convert n-phased quantities of the polyphase synchronous machine 1—for example, the n phase currents of the stator, or the current space vector—into the biaxial, stator-fixed coordinate system AB with a component in the direction of the axes A and a component in the direction of the axis B. However, the windings of the stator can be connected as a star or as an n-gon. In the case of a n-gon circuit, it must be considered, as is known, that the measured phase currents $I_u$, ..., $I_n$ of the phases U, ..., N are converted via the known n winding impedances $Z_{12}$, $Z_{23}$, ..., $Z_{n1}$ into the n currents of the n windings (and thus into the current space vector) before a Clarke transformation can be performed. In the case of a star connection, the measured phase currents $I_u$, ..., $I_n$ in the phases U, ... N already correspond to the currents in the windings. In consideration of the fact that both in the star connection of the stator with ungrounded neutral point and in a n-gon stator circuit, the sum of the instantaneous current values $I_u$, ..., $I_n$ is always zero, the detection of only n−1 of the instantaneous phase currents $I_u$, ..., $I_{n-1}$ is necessary, whereby the Clarke transformation can be simplified. The invention described below is therefore equally applicable to a star connection and to n-gon connection of the n phases of the polyphase synchronous machine 1. In the description of the invention that follows, a star connection of the stator is assumed without restricting the generality, for which reason reference is also made to the phase currents $I_u, \ldots, I_n$, since they are identical to the currents of the windings in this case.

Figure 2:
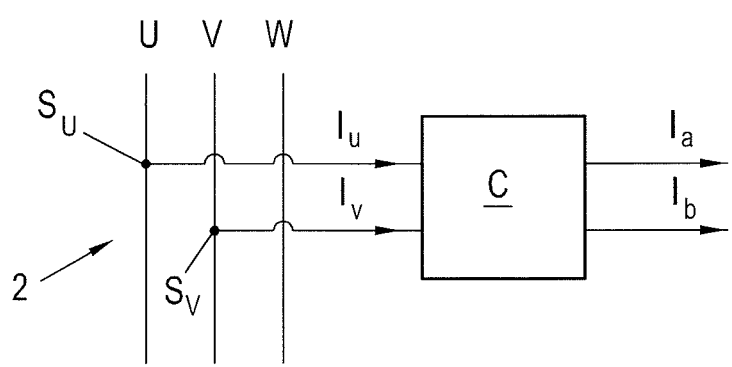
FIG. 2 shows the detection of two instantaneous current values and the formation of two current components.

In the case of the three-phase (n=3) polyphase power network illustrated in the example, the Clarke transformation can be applied in order to convert three-phase quantities such as the instantaneous current values of the phase currents $I_u$, $I_v$, $I_w$ into the biaxial coordinate system AB of the stator with the axes A and B. In consideration of the fact that the sum of the three instantaneous current values $I_u$, $I_v$, $I_w$ is always zero, it is only necessary to detect two (n−1) of the three (n) instantaneous current values $I_u$, $I_v$, $I_w$ for the Clarke transformation in the case of a three-phase network, as shown in FIG. 2. From two of the three instantaneous current values $I_u$, $I_v$, $I_w$ rotated by 120° with respect to one another, a current space vector is formed in a transformation component C by means of the Clarke transformation that is represented in the biaxial, stator-fixed coordinate system AB by the current components $I_a$ and $I_b$, which are normal to each other. In the example according to FIG. 2, the respective instantaneous current value of the phase currents $I_u$ and $I_v$ of the three-phase polyphase power network are detected by means of suitable sensors $S_u$ and $S_v$ on a first phase U and on a second phase V, for example, and converted in the Park transformation component C into the biaxial coordinate system AB of the stator. The selection of phase currents $I_u$, $I_v$, $I_w$ illustrated in FIG. 2 is to be regarded merely as exemplary. As will readily be understood, the selection of two other phase currents $I_u$, $I_v$, $I_w$ would also be possible.

In consideration of the previously mentioned rotation angle φ, it is possible by means of a simple trigonometric correlation to also form a corresponding first current component $I_q$ and a second current component $I_d$ in the biaxial, rectangular coordinate system QD of the rotor with the axes Q and D. This first current component $I_q$ and second current component $I_d$ yield the rotating current space vector as a vectorial sum. As is known, however, the first current component $I_q$ and a second current component $I_d$ can also be determined directly from the measured phase currents $I_u$, $I_v$, $I_w$ by means of the Park transformation with the aid of the rotation angle φ. For this purpose, it is common to detect the rotation angle φ, which represents the rotor position, by means of suitable sensor technology, such as a known rotary encoder, for example. The first current component $I_q$ lies crossways to the flow of the rotor permanent magnets and is therefore usually referred to as cross current. The first current component $I_q$ is therefore the current component that is responsible for generating the torque of the polyphase synchronous machine 1. As is known, an instantaneous torque M of the polyphase synchronous machine 1 can be determined from the calculated first current component $I_q$ using a corresponding motor torque constant KT.

Figure 3:
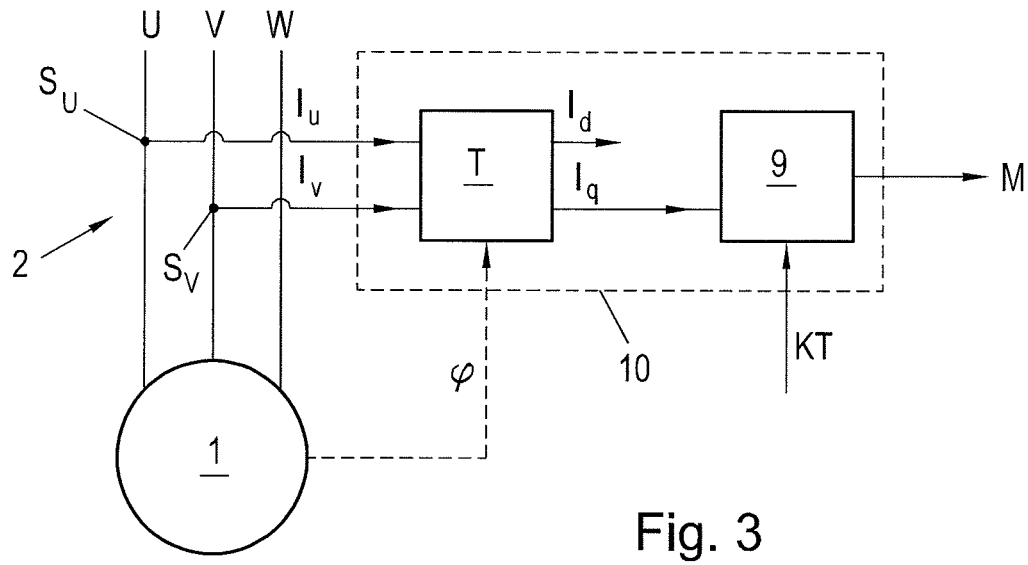
FIG. 3 shows the formation of a state variable.

As is known, the current components $I_a$, $I_b$ of the stator-fixed coordinate system or, equally, the current components $I_q$, $I_d$ of the rotor-fixed coordinate system can be used to determine state variables of the polyphase synchronous machine 1, such as a torque or power, for example. However, these current components $I_a$, $I_b$ and $I_q$, $I_d$ can also themselves be regarded as state variables. For the sake of example, FIG. 3 shows how a state variable G—here a torque M—of a polyphase synchronous machine 1 is calculated. The phase currents $I_u$, $I_v$ detected with the current sensors $S_u$, $S_v$ are transformed in the transformation component T as described above into the current components $I_a$, $I_b$ of the stator-fixed coordinate system AB or, equally, into the current components $I_q$, $I_d$ of the rotor-fixed coordinate system QD. The torque M is then calculated as the state variable G of the polyphase synchronous machine 1 from the torque-generating current component $I_q$ in the calculation unit 9 through multiplication with the known motor torque constant KT of the polyphase synchronous machine 1.

The transformation unit T and the calculation unit 9 can of course also be integrated into a single unit, for instance into a calculation module 10 as indicated in FIG. 3. The transformation unit T and the calculation unit 9 can be embodied as hardware or as software.

To calculate the state variable G, the rotation angle φ can also be fed to the transformation unit T in order to enable calculation of the above transformations. In a simplified embodiment, the rotation angle φ can also be omitted. In this case, it is assumed that the current space vector corresponds to the torque-generating current component $i_q$. A current component $i_{q,max}$ is thus determined that is greater than or at least equal to the actually effective, torque-generating current component $I_q$. If the state variable G is calculated with this current component $i_{q,max}$, the state variable G thus contains a kind of reserve, since the actual state variable G can never be greater than the calculated state variable G.

It should be noted here that use in linear motors is not excluded. In that case, the state variable G can be a force applied by the linear motor. The above remarks apply analogously.

The torque M of the three-phase synchronous machine 1 is a state variable G that can be associated with an especially high level of potential hazards during operation. For example, a polyphase synchronous machine 1 is used as a drive machine in installations using production engineering and manufacturing technology. It is the torque M applied by the polyphase synchronous machine 1 that is ultimately responsible for the forces that may occur. To prevent harm and damage to people and machines, the torque M, as the state variable G, must not exceed a previously selected permissible maximum value $G_{zul}$, for example a maximum torque $M_{zul}$, of the state variable in order to prevent consequential damage or injury, for example in the event of jamming at or in the abovementioned installation. Such state variables G are therefore oftentimes monitored with redundancy, particularly in safety-related applications in which danger to people or machines exists in the event of faults. However, it is also necessary for this purpose that the determined state variable G be able to be trusted.

Figure 4:
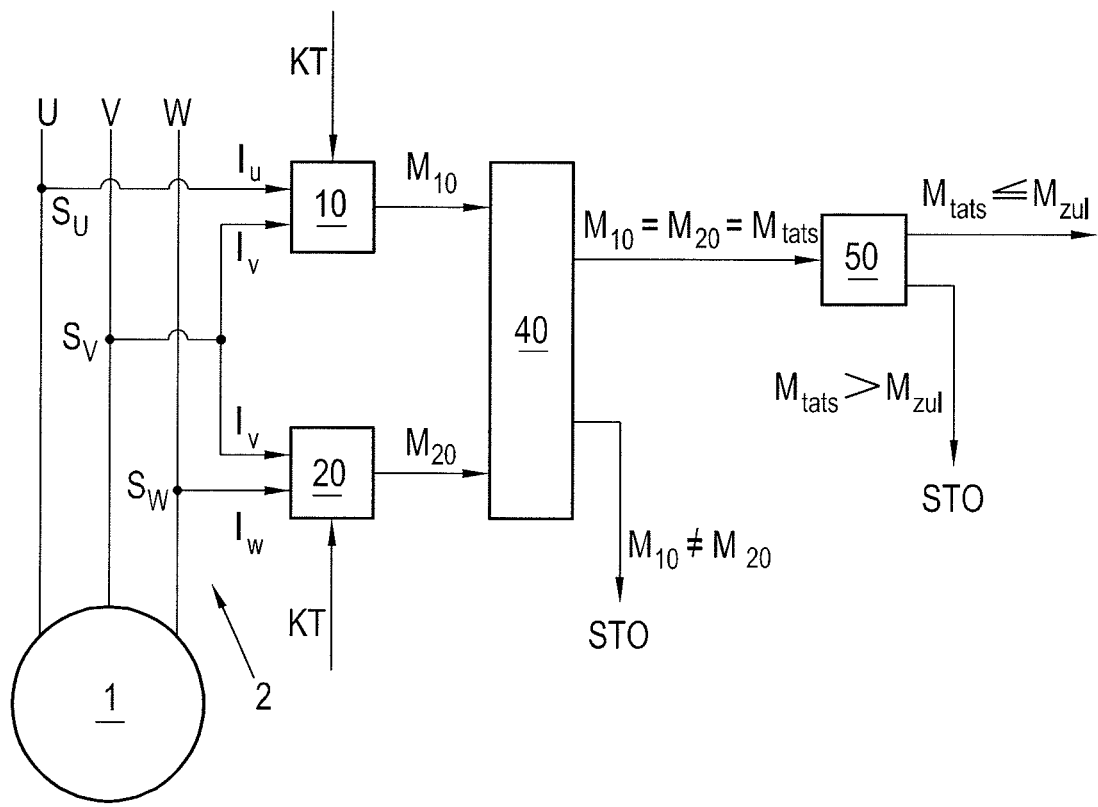
FIG. 4 shows the two-channel analysis according to the prior art.

FIG. 4 shows redundant monitoring according to the prior art as described in DE 10 2010 006 593 A1, for example. FIG. 4 shows a two-channel structure with two calculation components 10 and 20. A torque M is calculated as a state variable G within each of these, as described above. The first calculation component 10 differs from the second calculation component 20 through the instantaneous current values of the phase currents $I_u$, $I_v$, $I_w$ used. Via the sensors $S_u$ und $S_v$, the first calculation component 10 obtains the phase currents $I_u$, $I_v$ of phases U and V in order to determine the torque M. In contrast, the second calculation component 20 does use the instantaneous phase currents $I_v$, $I_w$ of phases V and W, which are detected via the sensors $S_v$ and $S_w$. The two calculation components 10 and 20 thus output a first torque $M_{10}$ and a second torque $M_{20}$. These two torques $M_{10}$ and $M_{20}$ are fed to a comparator 40 to determine a deviation between the two.

If the instantaneous current values $I_u$, $I_v$, $I_w$ were determined correctly and the first torque $M_{10}$ and second torque $M_{20}$ were calculated without error, the comparison of the two torques $M_{10}$ and $M_{20}$ in the comparator 40 does not yield any deviation (within established tolerance bands). In that case, it is assumed that the torques $M_{10}$ and $M_{20}$ correspond to an actually existent torque $M_{tats}$. The actually existent torque $M_{tats}$ is fed to a comparison component 50, where it is compared to a permissible torque $M_{zul}$. This permissible torque $M_{zul}$ represents an upper threshold value, for example, at which safe operation of the polyphase synchronous machine 1 can barely still be ensured. If the permissible torque $M_{zul}$ is exceeded, a shutdown of the polyphase synchronous machine 1 is triggered. The same applies in the event of a deviation of the two torques $M_{10}$ and $M_{20}$ from one another detected by the comparator 40.

In the example described above, the danger still exists, however, of the sensor $S_v$ being faulty and an incorrect instantaneous current value $I_v$ being used for the calculation of the torques $M_{10}$ and $M_{20}$ in both calculation components 10 and 20. In that case, it is conceivable that an error in the detecting of the instantaneous current value $I_v$ might not be detected during the comparison of the two torques $M_{10}$ and $M_{20}$, since the two torques $M_{10}$ and $M_{20}$ are equal nonetheless. This can result in a calculated torque $M_{10}$, $M_{20}$ being less than an actually acting torque. If the calculated torque $Mo_{10}$, $M_{20}$ is also even less than the permissible torque $M_{zul}$, this might lead to the endangerment of the safety of the polyphase synchronous machine 1. Harm to people or machines could therefore not be ruled out.

To prevent this, the other, remaining current pair $I_u$ and $I_w$ can be used in another variant (not shown in further detail in FIG. 4) for the calculation of another torque $M_{30}$. A provision is made here that it is determined or calculated in one of the two existing calculation components 10 or 20. One of the calculation components 10 or 20 thus calculates two torques, for example $M_{10}$ and $M_{30}$, when the first calculation component 10 is used for the dual calculation. However, an error in the calculation component 10 or 20 that is used for the dual calculation can, in turn, lead to a possible error not being detected. Situations can therefore sometimes occur in which safety cannot be unequivocally ensured despite the presence of multiple channels.

The procedure according to the invention is described with reference to FIG. 5 using the example of a three-phase synchronous machine 1 in star configuration, although, as mentioned previously, the invention can be generalized to any number of phases n≥3 and can also be applied to an n-gon circuit.

At least n−1 instantaneous phase currents $I_u, \ldots, I_{n-1}$ from n−1 phases U, . . . , N−1 of the n-phase polyphase power network 2 are detected. In the depicted exemplary embodiment, for example two (n−1) phase currents $I_u$, $I_v$ of the phases U, V of the three-phase (n=3) polyphase power network 2. By means of these at least n−1 instantaneous current values of the phase currents $I_u, \ldots, I_{n-1}$, the currently acting state variable G is calculated in the calculation component 10 as described. In addition, the instantaneous current values of all n phase currents $I_u, \ldots, I_n$ from the n-phase network are detected and used for a plausibility check of the at least n−1 current values of the phase currents $I_u, \ldots, I_{n-1}$. All n detected instantaneous current values of all phase currents $I_u, \ldots, I_n$ are thus themselves used for a check. This enables immediate checking, thus minimizing cumulative errors resulting from additional calculations. For example, the determination of a state variable G from the instantaneous phase currents $I_u, \ldots, I_n$ followed by a check of the plausibility of the instantaneous phase currents $I_u, \ldots, I_n$ from the previously determined state variable G would mean an additional computation step and thus another source of errors.

For this purpose, a monitoring module 60 is provided to which the current values of all phase currents $I_u, \ldots, I_n$ are fed. The plausibility checking of the at least n−1 current values of the phase currents $I_u, \ldots, I_{n-1}$, which are used to determine the state variable G, is performed in the monitoring module 60 by correlating all n phase currents $I_u, \ldots, I_n$ with one another and using the result of the correlation for plausibility checking. A correlation is of course used that leads to a known, expected result. Preferably, the correlation is performed by applying Kirchhoff's first law to all n phase currents $I_u, \ldots, I_n$ of the n phases U, . . . N of the polyphase power network 2. Both in star configurations and in n-gon connections of the windings of the polyphase synchronous machine 1, the sum of all n phase currents $I_u, \ldots, I_n$ must be equal to zero. In this way, it is easy to check the plausibility of the n detected, instantaneous current values of the phase currents $I_u, \ldots, I_n$. If the sum of the n phase currents $I_u, \ldots, I_n$ does not yield zero, an error must be present, for example in the form of a defective current sensor $S_U$, $S_V$, $S_W$ of a damaged or loose cable or the like. In any case, the result of the calculation of the state variable G must not be trusted in the event of a negative plausibility check, and appropriate action must be taken.

Advantageously, the result of the plausibility check is outputted by the monitoring component 60 in the form of a plausibility signal S.

Figure 5:
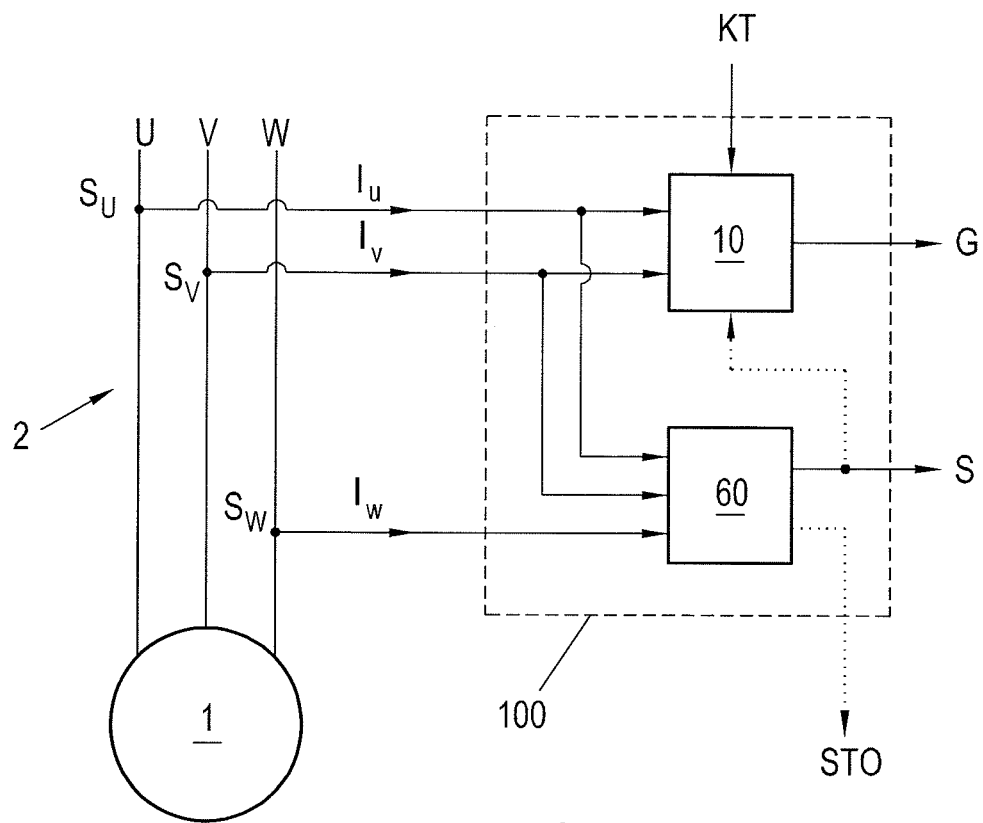
FIG. 5 shows the method according to the invention for calculating a state variable.

In the exemplary embodiment described in relation to FIG. 5, the outputted plausibility signal S can thus contain information to the effect that the plausibility check is positive and that the detected n−1 instantaneous current values of the n−1 phase currents $I_u$, $I_v$ do in fact yield zero in combination with the nth phase current $I_w$. This means that the detected n−1 instantaneous current values of the phase currents $I_u$, $I_v$ were detected correctly by the corresponding sensors $S_u$, $S_v$ and constitute a correct basis for the further calculation of the state variable G. In this case, the signal S can also be used, for example, to output a positive status message, for example in the form of a green light indicator or the like, or to forward it to a higher-level control unit.

In the case of a negative plausibility check, the plausibility signal S would indicate, for example, that at least one of the n current sensors $S_u$, $S_v$, $S_w$ is faulty or measuring incorrectly. Since instantaneous current values $I_u$, $I_v$ that may be faulty are thus fed to the at least one calculation module 10, the calculated state variable G also cannot constitute a suitable basis for an additional check of the functioning of the polyphase synchronous machine 1. In this case, the plausibility signal S can also be used to output a negative status message, for example to activate a red warning light or the like, or it can be transmitted to a higher-level control unit for further processing. As will readily be understood, in the negative case, the activation of an immediate stoppage of the polyphase synchronous machine 1, for example in the form of a save torque off function STO as indicated in FIG. 5, is also conceivable. As indicated in FIG. 5, the plausibility signal S can also be fed to the calculation module 10 and ensure that, in the event of a negative plausibility check, the calculation of the state variable G is not carried out.

The calculation module 10 and the monitoring module 60 can be separate hardware units, but they can also be integrated into a common hardware unit, such as monitoring unit 100, as indicated in FIG. 5. Likewise, it is of course possible to carry out the function of the calculation module 10 and/or of the monitoring module 60 both in hardware or in software.

Figure 8:
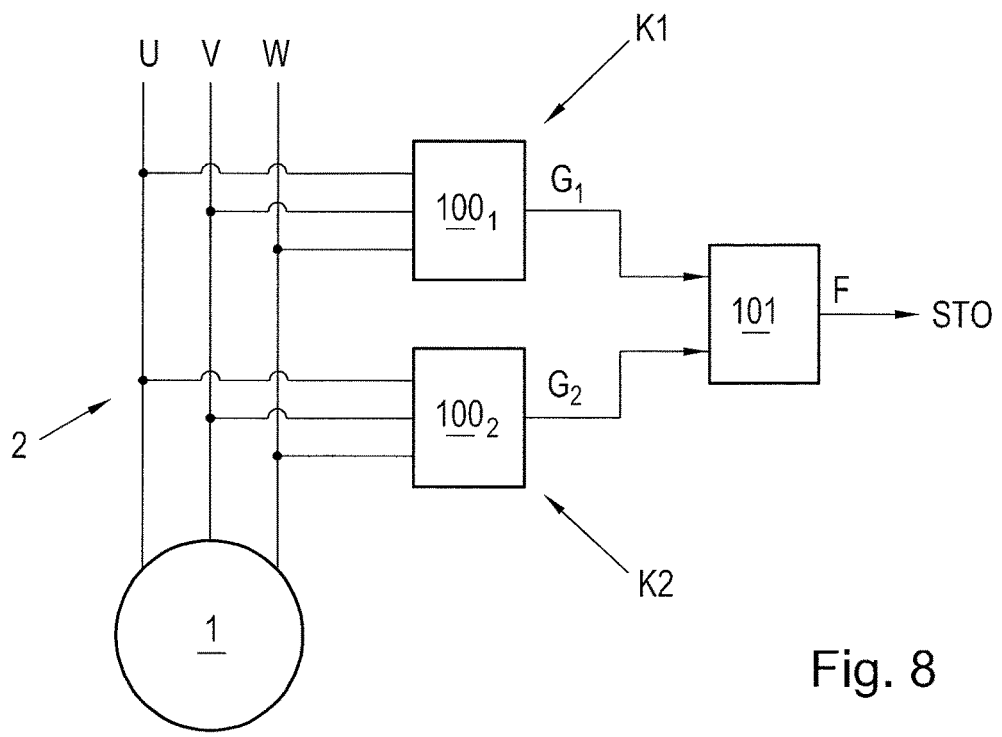

In order to achieve an especially high level of safety, the calculation module 10 and/or the monitoring module 60 or the monitoring unit 100 can also be designed with redundancy. For example, different pairs of current values $I_u$, $I_v$, $I_w$, can be fed for this purpose to several calculation modules 10, or several calculation modules 10, monitoring module 60 or monitoring units 100 can be present in order to achieve greater reliability. If unequal results are outputted at these redundant calculation modules 10, monitoring modules 60 or monitoring units 100, then a save torque off function STO can also be triggered. The results of these modules can be compared to one another for this purpose. A classic multi-channel structure as shown in FIG. 8 can thus also be constructed in which the same calculation is performed in each channel K1, K2, for example by implementing a monitoring unit 1001, 1002 with calculation modules 10 and monitoring module 60 in each channel K1, K2. The physical quantity G1, G2 calculated in each channel K1, K2 can then be compared in an calculation unit 101. If the physical quantities G1, G2 calculated in the different channels K1, K2 are not equal (preferably within a predetermined tolerance band), a signal F can also be outputted; for instance, a save torque off function STO can be activated. The safety can be increased even further through this redundancy.

Figure 6:
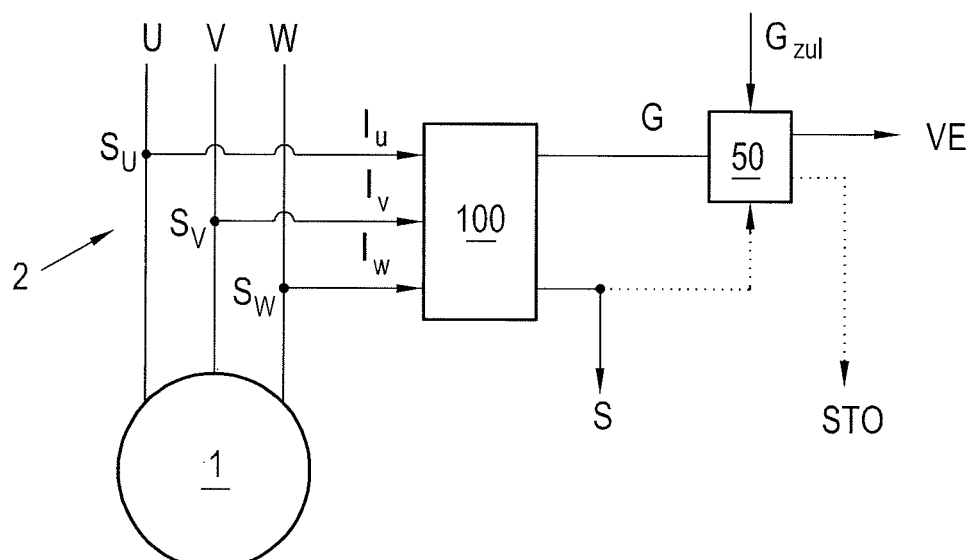
FIG. 6 shows a comparison of the currently acting state variable to a threshold value.

As can be seen in FIG. 6, the determined, currently acting state variable G can also be compared in a comparison module 50 to a threshold value $G_{zul}$ and a corresponding comparative result VE outputted. A permissible threshold value $G_{zul}$ of the state variable G can be set by a higher-level control unit (not shown in further detail) and can also change over time. A threshold value $G_{zul}$ can also change over time during the operation of the polyphase synchronous machine 1, for example if different tasks are performed by the polyphase synchronous machine 1 during a given time. This comparison can also be carried out in each channel of a multichannel structure.

The plausibility signal S can also be used to activate the comparison module 50 in the event of a positive plausibility check or to deactivate it otherwise. For this purpose, the plausibility signal S can also be fed to the comparison module 50, as indicated in FIG. 6. In the event of a negative plausibility check, this can also be used in the comparison module 50 to always output a negative comparative result VE or to activate the save torque off function STO.

The comparison performed in the comparison module 50 provides information on the reaching, overshooting or even failure to reach possible ranges or values of the state variable G that are to be avoided for safety reasons, for example. The outputting of the comparative result VE enables a great number of possible actions that can be taken based on the comparative result VE. For example, corresponding status messages can occur, such as green or red light indicators, an acoustic warning signal, the sending of an error message to a higher-level control unit, etc. A negative comparison, i.e., the reaching or even overshooting of a permissible threshold value $G_{zul}$, can also lead to the immediate stopping of the polyphase synchronous machine 1, for example in the form of an activated save torque off function STO. As a result of the save torque off function STO, the polyphase synchronous machine 1 no longer receives any power supply that can lead to a rotational movement. The save torque off function STO thus ensures that the polyphase synchronous machine 1 is stopped.

Figure 7:
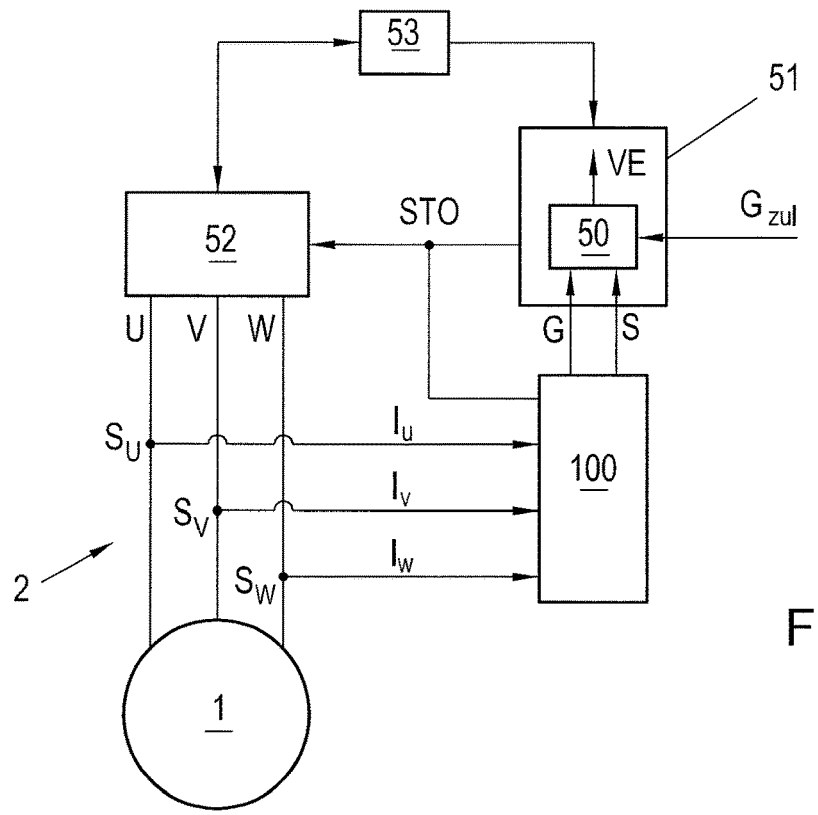
FIG. 7 shows a polyphase synchronous machine with reliable determination of a state variable and FIG. 8 shows a multichannel structure of the invention.

It is also described in FIG. 7 how the inventive reliable determination of the state variable G can be used to operate a polyphase synchronous machine 1. The polyphase synchronous machine 1 is supplied with electric current in a known manner by a power unit 52, for example in the form of a converter circuit. The power unit 52 is controlled for this purpose by an engine control unit 53, for example in the form of a known PWM (pulse width modulation) signal. The engine control unit 53 can also receive commands or a demanded control variable for this purpose, such as a desired torque, for example, from a higher-level control unit 51. The engine control unit 53 could also be integrated into the higher-level control unit 51 for this purpose. The phase currents $I_u$, $I_v$, $I_w$ of the polyphase power network 2, which connects the power unit 52 to the polyphase synchronous machine 1, are detected, and the state variable G of the polyphase synchronous machine 1 is determined therefrom in the monitoring unit 100 as described. In the depicted exemplary embodiment, the comparison module 50 is integrated into the higher-level control unit 51 (either as hardware or software). The comparison module 50 receives the determined state variable G, and optionally the plausibility signal S as well, and compares the state variable G to a predetermined permissible threshold value $G_{zul}$. The comparative result VE can be further processed in the higher-level control unit 51, for example in the form of an SLT function in the case a torque is the state variable G. Various actions can be triggered in dependence on the implementation of the further processing. In applications that are critical for safety, the triggering of a save torque off function STO of the polyphase synchronous machine 1 is common which stops the polyphase synchronous machine 1. However, the save torque off function STO can also be triggered by the monitoring unit 100.

The invention claimed is:

1. A method for reliably determining a state variable of a polyphase synchronous machine supplied with electric current by an n-phase polyphase power network, where n≥3, the method comprising:
    detecting current values of at least n−1 phase currents from at least n−1 phases of the polyphase power network;
    determining the state variable via current values of the at least n−1 phase currents;
    detecting current values of all n phase currents from the n-phases of the polyphase power network; and
    correlating the n phase currents with one another,
    wherein a result of the correlating of all n phase currents is used for a plausibility check of the n−1 phase currents from which the state variable is determined.

2. The method according to claim 1, wherein the plausibility check comprises a summation of the current values of all n phase currents of the polyphase power network.

3. The method according to claim 1, wherein the result of the plausibility check is outputted as a plausibility signal S.

4. The method according to claim 1, wherein a first current component is determined from the at least n−1 phase currents and the state variable is determined from this first current component.

5. The method according to claim 4, wherein a torque is determined as a state variable from the first current component.

6. The method according to claim 1, further comprising comparing the state variable to a permissible threshold value and outputting a comparative result.

7. The method according to claim 1, wherein the state variable is calculated in several channels and the state variables calculated in the several channels are compared to one another and the result of the comparison is outputted as a signal.

8. A method comprising:
    determining the state variable of the polyphase synchronous machine according to the method claim 1, wherein the determined state variable is used to monitor operation of the polyphase synchronous machine.

9. The method according to claim 8, wherein, in an event of:
a negative plausibility check; or
a reaching or overshooting of the threshold value, or
a negative comparison of state variables calculated in each of several channels,
the method further comprises triggering a save torque off function of the polyphase synchronous machine.

10. A device for reliably determining a state variable of a polyphase synchronous machine connected to an n-phase polyphase power network, where n≥3, as a power supply, the device comprising:
a calculation module configured to determine the state variable from current values of at least n−1 phase currents from at least n−1 phases of the polyphase power network;
a monitoring module configured to correlate all n phase currents from the n-phase polyphase power network with one another,
wherein the monitoring module carries out a plausibility check of the n−1 phase currents from which the state variable is calculated.

11. The device according to claim 10, further comprising a comparison module configured to compare the calculated state variable to a permissible threshold value.

12. The device according to claim 11, wherein the monitoring module transmits a result of the plausibility check as a plausibility signal to the comparison module.

13. The device according to claim 10, further comprising:
several channels, in each of which, the state variable is determined; and
a calculation unit configured to compare the state variables determined in the several channels and to output a result of the comparison as a signal.

* * * * *